United States Patent [19]

Moore et al.

[11] 4,329,707

[45] May 11, 1982

[54] GLASS-SEALED POWER THYRISTOR

[75] Inventors: David L. Moore; John A. Ostop, both of Jeannette; Joseph E. Johnson, Pittsburgh, all of Pa.

[73] Assignee: Westinghouse Electric Corp., Pittsburgh, Pa.

[21] Appl. No.: 169,249

[22] Filed: Jul. 16, 1980

Related U.S. Application Data

[63] Continuation of Ser. No. 942,577, Sep. 15, 1978.

[51] Int. Cl.³ .................... H01L 23/30; H01L 23/48; H01L 29/44
[52] U.S. Cl. ...................................... 357/73; 357/68; 357/52; 357/55
[58] Field of Search ....................... 357/38, 52, 53, 55, 357/68, 73, 81

[56] References Cited

U.S. PATENT DOCUMENTS

| | | | |
|---|---|---|---|
| 3,146,135 | 8/1964 | Sah | 357/73 |
| 3,328,650 | 6/1967 | Boyer | 357/81 |
| 3,351,825 | 11/1967 | Vidas | 357/52 |
| 3,436,612 | 4/1969 | Grosvalet | 357/53 |
| 3,506,502 | 4/1970 | Nakamura | 357/73 |
| 3,573,115 | 3/1971 | Topas | 357/38 |
| 3,588,632 | 6/1971 | Nakata | 357/68 |
| 3,643,136 | 2/1972 | Tuft | 357/55 |
| 3,755,720 | 8/1973 | Kern | 357/73 |
| 3,913,127 | 10/1975 | Suzuki et al. | 357/73 |
| 4,047,196 | 9/1977 | White et al. | 357/73 |

Primary Examiner—Andrew J. James
Attorney, Agent, or Firm—J. B. Hinson

[57] ABSTRACT

A glass disc-shaped thyristor is disclosed. The thyristor comprises a body of semiconductive material having a first emitter region, a first base region, a second base region and a second emitter region therein. A cathode electrode and a gate electrode are affixed to one major surface, and an anode electrode is affixed to the second major surface of the body of semiconductor material. The cathode electrode is disc-shaped and is concentrically positioned with respect to the annular-shaped gate electrode. A ring-shaped glass member is affixed to a first major surface of the body of semiconductive material and to the edges of the cathode and base electrodes to form a seal protecting a PN junction at the interface of the first emitter and base regions. An anode electrode is affixed to the second major surface of the body of semiconductive material. A second annular shaped glass member is affixed to the edge of the body of semiconductive material to form a seal protecting PN junctions formed at the interface of the first and second base regions and at the interface of the second base region with the second emitter region. The first and second ring-shaped glass members are formed by fusing glass preforms in an atmosphere comprising a predetermined mixture of nitrogen and water vapor to cause the glass preforms to soften and fuse to the surfaces of the body of semiconductive material to form a protective seals.

18 Claims, 9 Drawing Figures

GLASS-SEALED POWER THYRISTOR

This is a continuation of application Ser. No. 942,577, filed Sept. 15, 1978.

CROSS REFERENCE TO RELATED APPLICATIONS

Patent application Ser. No. 891,090 and Ser. No. 897,323 assigned to the same assignee as this application disclose a diode encapsulated by fusing glass to the semiconductor. These applications are related to the present invention in that the present application discloses a similar technique for encapsulating a thyristor.

BACKGROUND OF THE INVENTION

1. Field of the Invention

The invention relates to semiconductor devices and more specifically to a disc-shaped thyristor having a cathode and gate electrode on one major surface and an anode electrode on a second major surface with the thyristor encapsulated by fusing glass directly to the body of semiconductor material.

2. Description of the Prior Art

Prior art semiconductor devices using glass fused directly to the semiconductor portion of the device as a sole means for protecting the PN junctions from the environment have been limited to relatively low current diodes. An example of such a diode is type UT4005 manufactured and sold by the Unitrode Corporation. It is also known in the prior art to encapsulate semiconductor devices in thermosetting resinous insulating material. Examples of such hermetically sealed devices using resinous material are disclosed in U.S. Pat. Nos. 3,475,662, 3,476,978, and 3,476,988 as well as 3,486,084. Thin glass protective layers are also available in the prior art to passivate semiconductor devices. These thin passivation layers was typically applied to the body of semiconductor material as a slurry and the device and the powered glass were heated to fuse the glass to form a passivating glass layer. Glass layers formed using this technique where limited in thickness to the order of 20 or 30 microns. These thin layers are not sufficient to provide complete environmental protection for the PN junctions within the semiconductor material.

SUMMARY OF THE INVENTION

The invention comprises a disc-shaped thyristor having the cathode and gate electrodes on one major surface and the anode electrode on a second major surface. The thyristor uses a disc-shaped body of semiconductor material having first and second substantially flat surfaces and an edge portion extending therebetween. The body of semiconductor material includes a first emitter region, a first base region, a second base region and a second emitter region. The first emitter and base regions extend to one surface of the body of semiconductor material. Cathode and gate electrodes are respectively affixed to the first emitter region and the first base region. The second emitter region extends to a second surface of the body of semiconductor material and the anode electrode is affixed thereto. A seal protecting a PN junction formed at the interface of the first emitter region and the first base region is formed by a first ring-shaped glass member fused to the first surface of the body of semiconductor material. A second ring shaped glass member is fused to the edge portion of the body of semiconductor material to provide a seal protecting PN junctions formed at the interface of the first and second base regions and at the interface of the second base region with the second emitter region.

DETAILED DESCRIPTION

Figure 1:
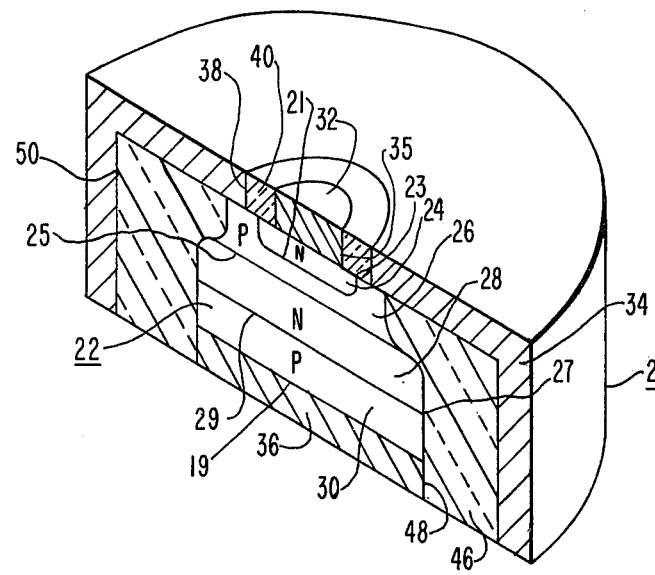
FIG. 1 is a drawing in partial cross section illustrating the preferred embodiment of the invention.

A disc-shaped thyristor comprising the preferred embodiment of the invention is illustrated in FIG. 1. The thyristor 20 includes a body of semiconductor material 22 (preferably silicon) having first and second substantially parallel opposed major surfaces 19 and 23 and an edge portion 27 extending therebetween. The body of semiconductor material 22 includes a first N conductivity type emitter region 24, a first P conductivity type base region 26, a second N conductivity type base region 28 and a second P conductivity type emitter region 30. Cathode, gate and anode electrodes 32, 34 and 36 are respectively affixed to the first emitter region 24, the first base region 26 and the second emitter region 30. A PN junction 21 is formed at the interface of the first emitter region 24 with the first base region 26. This PN junction extends to the upper surface 23 off the body of semiconductor material 22. A second PN junction 25 is formed at the interface of the first base region 26 and the second base region 28. The PN junction 25 extends to the edge portion 27 of the body of semiconductor material 22. Similarly a third PN junction 29 is formed at the interface of the second base region 28 and the second emitter region 30. This junction also extends to the edge portion 27 of the body of semiconductor material 22. The fusion utilized by the thyristor 20 consist of the body of semiconductor material 22 having the cathode, gate and anode electrodes 32, 34 and 36 affixed thereto, as described above.

The cathode electrode 32 is disc shaped and includes an outer edge 35. The gate electrode 34 is cup shaped and includes an inner edge 38. A ring-shaped glass member 40 is fused to the upper surface 23 of the body of semiconductor material 22 as well as the outer surface 35 of the cathode electrode 32 and the inner surface 38 of the gate electrode 34. The ring-shaped glass member 40 overlies PN junction 21 to provide a hermetic seal protecting this junction. A second ring-shaped electrical insulating glass member 46 is fused to the edge portion 27 of the body of semiconductor material 22, to edge 48 of the anode electrode 36 and to inner surface 50 of the gate electrode 34. The second ring-shaped electrically insulating glass member 46 provides a hermetic seal protecting the edge portion 27 of the body of semiconductor material 22.

The cathode electrode 32, gate electrode 34 and anode electrode 36 are preferably made of a metal such as molybdenum, tungsten or tantalum for example. The cathode and gate electrodes 32 and 34 are preferably affixed to the body of semiconductor material 22 by first forming a thin layer of electrodeless nickel on the surfaces of the body of semiconductor material 22 and silver soldering the electrodes thereto. The anode electrode 36 may be silver soldered to the second emitter region 30. The melting point of the silver solder used should be above the fusion temperature of (approximately 720° C.) of the ring-like glass member 40 and 46. The processes for affixing the cathode, gate and anode electrodes 32, 34 and 36 are well known in the art.

The thicknesses of the cathode electrode 32, the gate electrode 34 and the anode electrode 36 must be selected such that destructive stresses do not develop during temperature cycling of the thyristor 20. Typical thickness for the cathode, gate and anode electrodes, 32, 34 and 36 are respectively in the order of 0.010, 0.010 and 0.035 inches. A typical diameter for the body of semiconductor material 22 is 0.650 inches. Cathode electrode 32 has a typical diameter of 0.350 inches. A typical inner diameter for the gate electrode 34 is 0.045 inches. Ring-shaped glass member 46 has a typical width of 0.015 inches. The body of semiconductor material 22 has a typical thickness of 0.010 inches.

Figure 2:
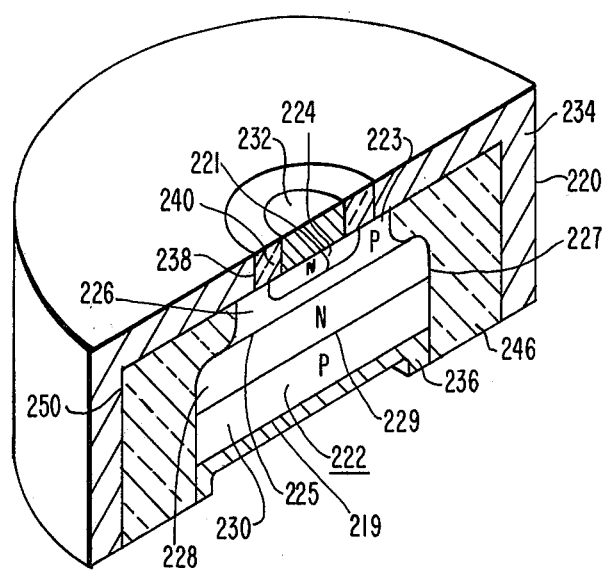
FIG. 2 is a drawing partially in cross section illustrated in a second embodiment of the invention.

A second thyristor 220 comprising a second embodiment of the invention is illustrated in FIG. 2. The reference numerals used in FIG. 1 preceded by a two are used in FIG. 2 to identify similar parts. The thyristor 220 includes a body of semiconductor material 222 having substantially parallel opposed major surfaces 223 and 219 and an edge portion 227 extending therebetween. The body of semiconductor material 222 includes a first emitter region 224, a first base region 226, a second base region 228, and a second emitter region 230. Cathode, gate and anode electrodes 232, 234, and 236 are respectively affixed to the first emitter region 224, the first base region 226 and the second emitter region 230. A ring-like glass member 240 is fused to the upper surface 223 of the body of semiconductor material 222 to provide a hermetic seal protecting PN junction 221. Similarly a second ring-like glass member 246 is fused to the edge portion 227 to provide a hermetic seal protecting this edge of the body of semiconductor material 222. Thyristor 220 is identical to thyristor 20 illustrated in FIG. 1 except that the anode electrode 236 is cup-shaped as compared to the disc-shaped anode electrode 36 of thyristor 20 illustrated in FIG. 1.

Figure 3:
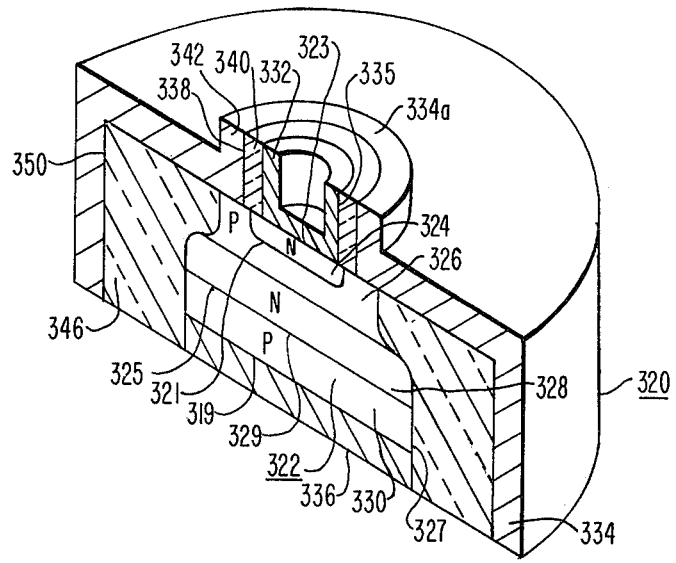
FIG. 3 is a drawing partially in cross section illustrated in a third embodiment of the invention.

FIG. 3 is a third thyristor 320 comprising a third embodiment of the invention. The reference numerals utilized in FIG. 1 preceded by a three have been utilized to identify similar parts. Thyristor 320 includes a body of semiconductor material 322 having substantially parallel opposed major surfaces 323 and 319 and an edge portion 327 extending therebetween. The body of semiconductor material 322 includes a first emitter 324, a first base region 326, a second base region 328, and a second emitter region 330. Cathode, gate and anode electrodes 332, 334 and 336 are respectively affixed to the first emitter region 324, the first base region 326 and the second emitter region 330. A ring-shaped glass member 340 is fused to the upper surface 323 of the body of semiconductor material 322 and to the edges of cathode electrode 332 and gate electrode 334 to form a hermetic seal protecting PN junction 321. Similarly, a second ring-shaped glass member 346 is fused to the edge portion 327 of the body of semiconductor material 322 to form a hermetic protecting this edge. Thyristor 320 is identical to thyristor 20, illustrated in FIG. 1, except that the cathode electrode 332 is cup-shaped and gate electrode 334 includes an upward extending rim portion 342 along its inner edge. The combination of the cup-shaped cathode electrode 332 and the rim portion 342 of gate electrode 334 provides additional surface to which glass member 340 is fused.

Figure 4:
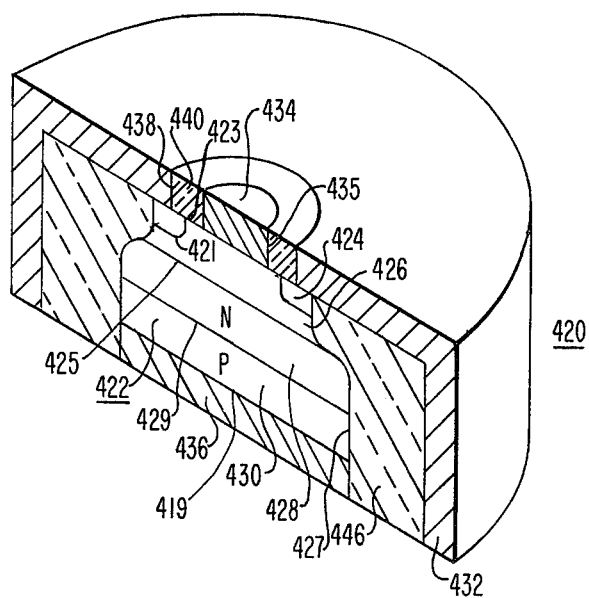
FIG. 4 is a drawing partially in cross section illustrating a fourth embodiment of the invention.

A fourth thyristor 420 which comprises a fourth embodiment of the invention is illustrated in FIG. 4. The reference numerals utilized in FIG. 1 preceded by a four have been used to identify functionally similar parts. Thyristor 420 includes a body of semiconductor material 422 having substantially parallel opposed major surfaces, 423 and 419, and an edge portion 427 extending therebetween. The body of semiconductor material 422 includes a first emitter 424, a first base region 426, a second base region 428 and a second emitter region 430. Cathode, gate and anode electrodes 432, 434 and 436 are respectively affixed to the first emitter region 424, the first base region 426 and the second emitter region 430. A ring-shaped glass member 440 is fused to the upper surface 423 of the body of semiconductor material 422 and to the edge of cathode electrode 432 and gate electrode 434 to form a hermetic seal protecting PN junction 421. A second ring-shaped glass member 446 is fused to the outer edge portion 427 of the body of semiconductor material 422 to form a hermetic seal protecting this edge.

Thyristor 420 is identical to the thyristor 20, illustrated in FIG. 1, except that the position of the first emitter region 424 and the first base region 426 have been reversed from the functionally similar first emitter and base region 23 and 26 of transistor 20 illustrated in FIG. 1.

Figure 5:
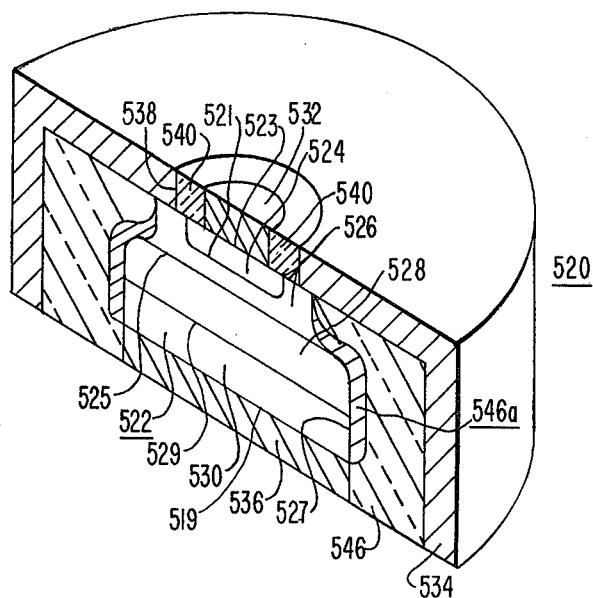
FIG. 5 is a drawing partially in cross section illustrated in another embodiment of the invention.

A fifth thyristor 520 which comprises another embodiment of the invention is illustrated in FIG. 5. In FIG. 5, the reference numerals utilized in FIG. 1 preceded by a number five are used to identify structurally and functionally similar parts. The thyristor 520 includes a body of semiconductor material 522 having first and second substantially parallel opposed major surfaces, 523 and 519 and an edge portion 527 extending therebetween. The body of semiconductor material 522 includes a first emitter region 524, a first base region 526, a second base region 528 and a second emitter region 530. Cathode, gate and anode electrodes 532, 534 and 536 are respectively affixed to the first emitter region 524, the first base region 526 and the second emitter region 530.

A ring-shaped glass member 540 is fused to the upper surface 523 of the body of semiconductor material 522 and the edges of cathode electrode 523 and gate electrode 534. A thin electrically insulating layer 546A, of silicon oxide for example, overlies and is fused to the edge portion 527 of the body of semiconductor material 522. Ring-shaped glass member 546 is fused to the thin electrically insulating layer 546A, the edge of anode electrode 536 and the inner surface of gate electrode 534 to form a hermetic seal protecting the edge portion 527 of the body of semiconductor material 522. Thyristor 520 is identical to thyristor 20 (FIG. 1) except for the thin electrically insulating layer 546A overlying edge portion 527 of the body of semiconductor material 522. The combination of the thin electrically insulating layer 546A and ring-shaped glass member 546 forms a hermetic seal protecting edge portion 527. This structure has the additional characteristic that the material for electrically insulating layer 546A can be selected for its electrical characteristics and the glass for ring-shaped glass member 546 for its thermal and mechanical properties.

The processes for constructing the various embodiments of the thyristor illustrated in FIGS. 1 through 5 are very similar. Therefore, the process for constructing thyristor 20 illustrated in FIG. 1 will be described followed by a description of the modifications necessary to construct the other embodiments.

The first step in constructing the thyristor 20 is to form the first emitter, first base, second base and the second emitter regions 24, 26, 28 and 30 in the body of semiconductor material 22. After these regions have been formed using conventional diffusion processes, for example, the anode electrode 36 is affixed to the second emitter region 30 along surface 19 by silver soldering, for example. Sand blasting is used to remove the edge of the body of semiconductor material 22 to form sloping edge portion 27. Cathode and gate electrodes 32 and 34 are affixed to the body of semiconductor material 22 by forming a thin layer of electrodeless nickel on upper surface 23 and silver soldering electrodes 32 and 34 thereto.

It is preferable that the cathode electrode 32 and the gate electrode 34 be affixed to the body of semiconductor material 22 using a non-alloying process which prevents diffusion regions from forming in the body of semiconductor material 22 because diffusion regions can cause stresses to develop in areas near the inner edge 38 of the gate electrode 34 and the outer edge 35 of the cathode electrode 22. These stresses can result in fracture of the body of semiconductor material 22. It is also desirable that the electrodes be affixed to the body of semiconductor material 22 using a process requiring a temperature in excess of the melting temperature (approximately 700° C.) of the glass used for the first glass ring-like glass member 40 and the second ring-like glass member 46.

A suitable process for affixing the cathode electrode 32 and the gate electrode 34 to the body of semiconductor material 22 is to form a thin layer of electrodeless nickel on the upper surface 23 of the body of semiconductor material 22. The cathode electrode 32 and the gate electrode 34 are then silver soldered to the body of semiconductor material 22. Silver solders are available for performing this operation in the neighborhood of 900° C. which is above the melting point for the ring-like glass members 40 and 46. During the silver soldering process the electrodeless nickel assures a good adhesion to the body of semiconductor material 22 and prevents the undesirable diffusion regions, common with alloying processes, from forming. Suitable processes for applying the electrodeless nickel and for silver soldering the electrodes, 32 and 34 to the body of semiconductor material 22 are well known in the semiconductor art.

Figure 6:
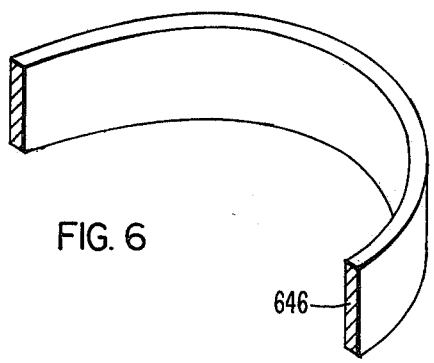
FIG. 6 is a drawing illustrating a first ring-shaped glass preform.
Figure 7:
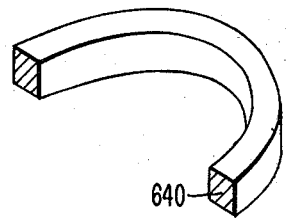
FIG. 7 is a drawing illustrating a second ring-shaped glass preform.

After the electrodes 32, 34 and 36 have been affixed to the body of semiconductor material 22 a first ring-shaped glass preform 640 (FIG. 7) is fused to the inner edge 38 of the gate electrode 34, the outer edge 35 of the cathode electrode 32 and the upper surface 23 of the body of semiconductor material 22 to produce the first ring-shaped glass member 40 and a second ring-shaped glass preform 646 (FIG. 6) is fused to the outer surface 27 of the body of semiconductor material 22, the edge of the anode electrode 36 and the lower surface of the gate electrode 34 to produce the second ring-shaped glass member 46.

The first step in fusing the glas preforms 640 and 646 to form the thyristor 20 is to clean the fusion and the ring-shaped glass preforms 640 and 646 using the following procedure:

(a) boil all the components in a reagent grade trichloroethylene;
(b) rinse all the components twice (one minute each time) in reagent grade trichloroethylene;
(c) rinse all the components ultrasonically (one minute each time) in reagent grade acetone; and
(d) dry the components in room air on filter paper.

Figure 8:
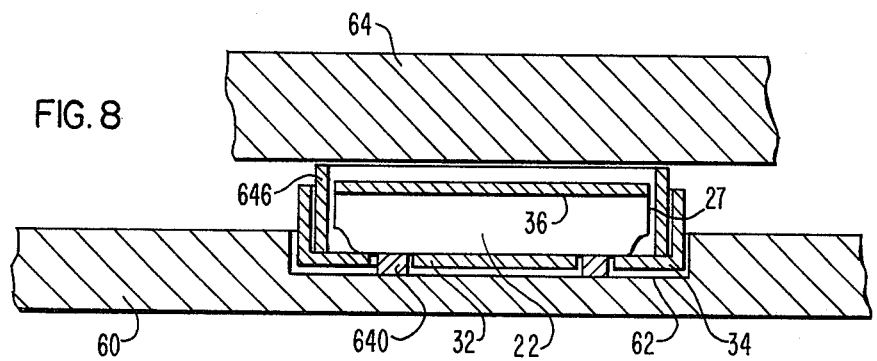
FIG. 8 is a drawing illustrating a jig used to hold the components of the thyristor.

Following cleaning as described above, the components are assembled in a jig as illustrated in FIG. 8. The jig includes a base member 60 having a recess 62 therein. The diameter of the recess 62 is selected such that the outer diameter of the gate electrode 34 fits snugly inside the recess 62. The ring-shaped glass preform 640 is positioned in the area between the cathode electrode 32 and the gate electrode 34. The second ring-shaped glass preform 646 is then positioned between the edge portion 27 of the body of semiconductor 22 and the inner edge of the gate electrode 34. The height of the first glass preform 640 is selected such that when assembled as shown in FIG. 8, the upper edge of the ring-shaped glass member 640 extends slightly above the cathode electrode 32 and the edge of the gate electrode 34. Similarly, the height of the second ring-shaped glass preform 646 is selected such that it extends above the top edge of the gate electrode 34 and the anode electrode 36. A graphite weight 64 is then positioned to rest on the upper edge of the ring-shaped glass preform 646. The components as assembled in FIG. 8 are then placed in a furnace and heated to fuse the ring-shaped glass preform 640 to form the ring-shaped member 40 and the second ring-shaped preform 646 to form the ring-shaped member 46.

The components as assembled in the jig are placed in a fusion furnace and an atmosphere which consists of a mixture of nitrogen and water vapor having a total pressure of one atmosphere with the partial pressure of the water vapor being between $10^{-3}$ to $10^{-2}$ atmospheres is established therein. The required atmosphere is achieved by mixing approximately two parts of dry nitrogen with one part of wet nitrogen and flowing the mixture through the furnace. Dry nitrogen is passed through one inch of deonized water in a bubbler to form the required wet nitrogen. After the required atmosphere has been established, the temperature in the furnace is increased and decreased in accordance with a preselected time temperature schedule illustrated in FIG. 9.

Figure 9:
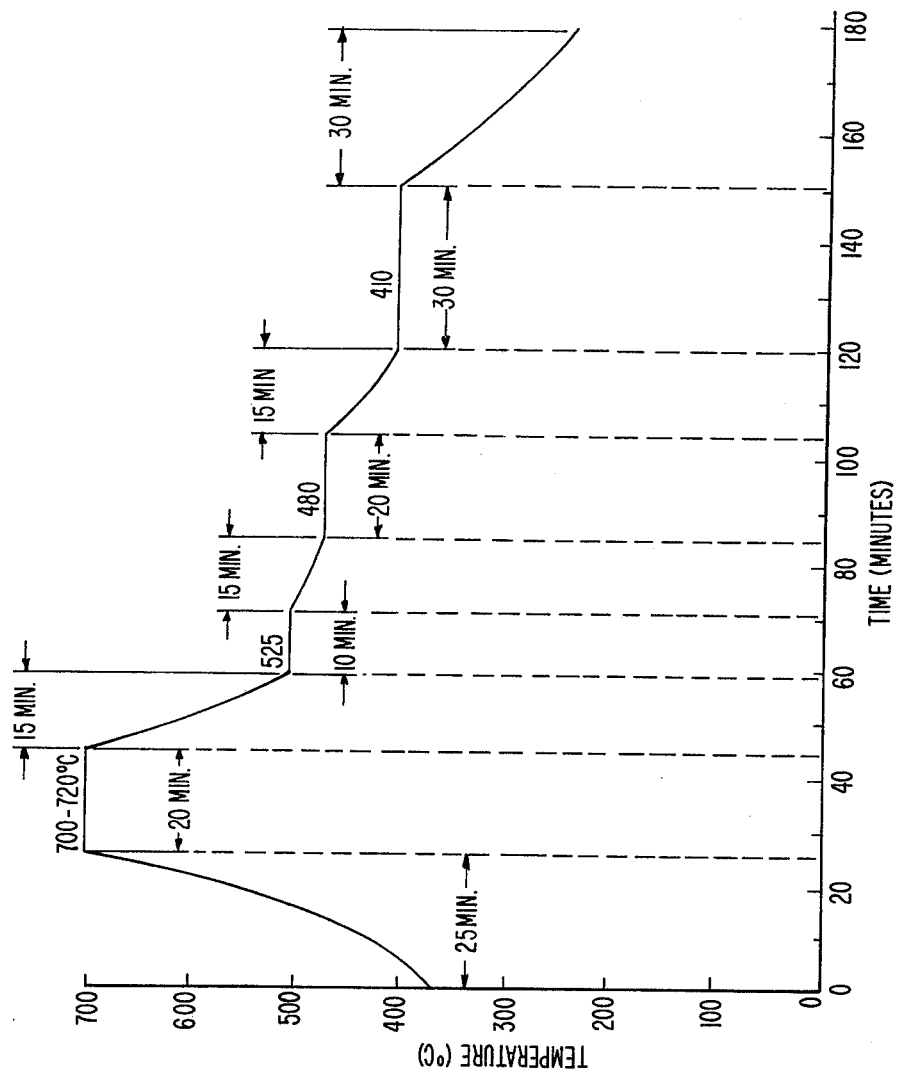
FIG. 9 is a time-temperature chart of the fusion furnace.

As can be seen from FIG. 9, the temperature of the furnace is initially in the range of 350° C. The temperature is increased to a temperature in the range of 700° to 720° C. in a time interval of approximately 25 minutes. This temperature is maintained for a period of approximately 20 minutes. The ring-shaped glass preforms 640 and 646 become soft and begin to flow at a temperature in the range of 700° C. Wetability of the silicon for the glass and pressure due to the top plate 64 causes a soft glass to flow evenly along the edges of the body of semiconductor material 22 and the edges of the electrodes. The cross section of the ring-shaped glass preform 646 is selected such that there is just sufficient material available to fill the area between the edge portion 27 of the body of semiconductor material 22 and the inner surface of the gate electrode 34. This results in the ring-like glass member 46 having the cross section as illustrated in FIG. 1. Similarly, the second ring-shaped glass preform 640 softens and fuses to the inner edge 38 of the gate electrode, the upper surface 23 of the body of semiconductor material 22 and the inner edge 38 of the gate electrode. The dimensions of this ring are also selected such that there is just sufficient material available to fill the region between the cathode electrode 32 and the gate electrode 34.

After a temperature in the range of 700° and 720° C. has been maintained for approximately 20 minutes the temperature of the furnace is reduced to approximately 525° C. in a time interval of approximately 15 minutes. A temperature of 525° C. is maintained for approximately 10 minutes followed by a reduction to 480° C. in a time interval of 15 minutes. A temperature of 480° C. is maintained for 20 minutes followed by a reduction to 410° C. in a time interval of approximately 15 minutes. The 410° C. temperature is maintained for 30 minutes followed by a reduction to room temperature in a time interval of approximately 30 minutes.

In selecting the glass for the ring-shaped glass preform 640 and 646 it is important the thermal expansion coefficients for the glass be matched to or greater than the temperature expansion coefficient of the semiconductor body 22. It should also be noted that the expansion characteristics of the glass with temperature are different from its contraction characteristics when a glass is cooled. All these characteristics must be considered in selecting a glass and a temperature cycle for the fusion furnace.

Suitable glasses for the ring-shaped preforms 640 and 646 have a temperature expansion coefficient in the range of 4.0 to $6.0 \times 10^{-6}$ centimeter/centimeter/°C. and the glass should be substantially free of alkali ions. In addition, (1) the glasses must have structural stability, e.g., must not be devitrify or go through detrimental phase separations during the fusion process;
(2) the glass must have good chemical resistance to the environment and humidity;
(3) the glass must have thermal expansion characteristics compatible with those of the fusion;
(4) the glass must wet and adhere to the semiconductor material;
(5) the glass must have a viscosity low enough to flow;
(6) the glass must not chemically attack the surfaces of the semiconductor or the electrodes in a detrimental way;
(7) the thermal characteristics of the glass must be such that stresses can be relieved at temperatures within the limitations of the thyristors;
(8) the glass must have a fusion temperature below the degradation temperature of the thyristor;
(9) the finished thyristor must be resilient against thermal shock, thermal cycling and have good mechanical strength.

Glasses having a composition by weight of:

| Constituent | Percentage |
| --- | --- |
| $SiO_2$ | 32-40% |
| $B_2O_3$ | 12-33% |
| PbO | 42-48% |
| $Al_2O_3$ | 2-6% | have been found to be suitable for the ring-shaped glass preforms 640 and 646.

In particular, a glass having a composition of:

| Constituent | Percentage |
| --- | --- |
| $SiO_2$ | 36 ± 4% |
| $B_2O_3$ | 15 ± 3% |
| PbO | 45 ± 3% |
| $Al_2O_3$ | 3 ± 1% | have been found to be particularly satisfactory. This glass is sold commercially by Inotec under Type No. IP745.

It has been found that mere uniform electrical characteristics are obtained when ring-shaped glass preforms which are cut from stress relieved glass tubing are used. These superior results are believed to be related to the fact that the prefabricated glass rings of this type have smoother interior surfaces and consistent prior thermal histories.

The other embodiments of the thyristor illustrated in FIGS. 2 through 5 can be constructed using essentially the same process discussed above for fabricating the thyristor 20 illustrated in FIG. 1. The primary exception is thyristor illustrated in FIG. 5. In this embodiment the thin insulating layer 546C is formed prior to the fusion of the ring-shaped glass preforms 640 and 646 to form ring-shaped glass members 40 and 46. This layer can be formed by depositing silicon oxide on the edge 527 of the body of semiconductor material 522. This oxide can also be grown utilizing well-known prior art processes. Once the insulating layer 546A has been formed, the remainder of the fabrication cycle is identical to the one described above with respect to the thyristor 20 illustrated in FIG. 2.

We claim:
1. A thyristor comprising:
(a) a body of semiconductor material having first and second substantially flat and opposed major surfaces and an edge portion extending therebetween, said body of semiconductor material including a first emitter region, a first base region, a second base region and a second emitter region with a first PN junction at the interface of said first emitter region with said first base region, a second PN junction at the interface of said first base region with said second base region and a third PN junction at the interface of said second base region with said second emitter region, said first emitter and base regions extending to said first substantially flat surface and said second emitter region extending to said second substantially flat surface;
(b) a cathode electrode having a first thickness affixed to said first emitter region along said first major surface of said body of semiconductor material;
(c) a cup shaped gate electrode having a second thickness affixed to said first base region along said first major surface of said body of semiconductor material such that said first PN junction extends to said first major surface of said body of semiconductor material between edge portions of said cathode electrode and said gate electrode, said cup shaped electrode encircling said body of semiconductor material;

(d) a first ring-shaped electrically insulating glass member affixed to said first major surface of said body a semiconductor material and, to edge portions of said cathode electrode and said gate electrodes thereby forming a seal protecting said first PN junction;

(e) an anode electrode having a third thickness affixed to said second emitter region along said second major surface of said body of semiconductor material, and (f) a second ring-shaped electrically insulating glass member affixed to said edge portion of said body of semiconductor material and to the inner surface of said cup shaped gate electrode thereby forming a seal protecting said second and third PN junctions, wherein;

(g) said first, second and third thicknesses are selected such that destructive stresses do not develop during thermal cycling of said thyristor.

2. A thyristor in accordance with claim 1 wherein said first and second ring-shaped glass members are substantially free of alkali elements.

3. A thyristor in accordance with claim 2 wherein said first and second ring-shaped glass members are composed of by weight $36\% \pm 4\%$ $SiO_2$, $17.5\% \pm 5.5\%$ $B_2O_3$, $45\% \pm 3\%$ $PbO$ and $4.0\% \pm 2\%$ $Al_2O_3$.

4. A thyristor in accordance with claim 3 wherein the edge of said gate electrode is substantially co-planar with upper surface of said cathode electrode.

5. A thyristor in accordance with claim 4 wherein said edge portion of said body of semiconductor material is tapered such that the area of said first major surface of said body of semiconductor material is less than the area of said second major surface of said body of semiconductor material.

6. A disc-shaped thyristor having first and second opposed surfaces, comprising:

(a) a body of semiconductor material having first and second substantially flat opposed major surfaces and an edge portion extending therebetween, said body of semiconductor material including a first emitter region, a first base region, a second base region and a second emitter region, said first emitter and base regions extending to said first major surface of said body of semiconductor material, said second emitter regions extend to said second major surface;

(b) a cathode electrode affixed to said first emitter region, a gate electrode affixed to said first base region with surface portions of said cathode and gate electrode being exposed along said first opposed surface of said thyristor;

(c) an anode electrode affixed to said second emitter region with one surface of said anode electrode exposed above said second opposed surface of said thyristor;

(d) a first ring-shaped glass member fused to said first surface of said body of semiconductor material to form a seal protecting a first PN junction formed at the intersection of said first emitter region with said first base region;

(e) a second ring-shaped glass member fused to said edge portion of said body of semiconductor material to form a seal protecting second and third PN junctions respectively formed at the interface of said first base region with said second base region and at the interface of said second base region with said second emitter region.

7. A disc-shaped thyristor in accordance with claim 6 wherein said body of semiconductor material is silicon.

8. A disc-shaped thyristor in accordance with claim 7 wherein said first emitter region is a circular N conductivity type region and extends to said first substantially flat opposed major surface of said body of semiconductor material, with said first emitter region being coaxially positioned with respect to said body of semiconductor material.

9. A disc-shaped thyristor in accordance with claim 8 wherein said portion of said first base region which extends to said first substantially flat opposed major surface of said body of semiconductor material is ring-shaped and surrounds said portion of said first emitter region which extends to said first substantially flat opposed major surface of said body of semiconductor material.

10. A disc-shaped thyristor in accordance with claim 6 wherein said portion of said first emitter region which extends to said first substantially flat opposed major surface of said body of semiconductor material is ring-shaped and is coaxially positioned with respect to said body of semiconductor material.

11. A disc-shaped thyristor in accordance with claim 10 wherein said portion of said first base region which extends to said first substantially flat opposed major surface of said body of semiconductor material is circular and coaxially positioned with respect to said body of semiconductor material and said portion of said first emitter which extends to said first substantially flat opposed major surface of said body of semiconductor material is ring-shaped and surrounds said portions of said first base region which extend to said first substantially flat opposed major surface of said body of semiconductor material.

12. A disc-shaped thyristor having first and second opposed surfaces, comprising:

(a) a body of semiconductor material having first and second substantially flat opposed major surfaces and an edge portion extending therebetween, said body of semiconductor material including a first emitter region, a first base region, a second base region and a second emitter region, said first emitter and base regions extending to said first major surface of said body of semiconductor material, said second emitter region extending to said second major surface of said body of semiconductor material;

(b) a cathode electrode affixed to said first emitter region, a gate electrode affixed to said first base region with surface portions of said cathode electrode and said gate electrode being exposed along said first surface of said thyristor;

(c) an anode electrode affixed to said second emitter, with one surface of said anode electrode being exposed along said second opposed surface of said thyristor;

(d) a layer of electrically insulating material affixed to said edge portion of said body of semiconductor material;

(e) a second ring-shaped glass member coaxially positioned with respect to said layer of insulating material with the inner surface of said ring-shaped glass member being fused to the outer surface of said layer of electrically insulating material, the combination of said layer of electrically insulating material and said ring-shaped glass member forming a seal protecting first and second PN junctions respectively formed at the intersection of said first base region with said second base region and at the intersection of said second base region with said second emitter region; and (d) a second ring-shaped glass member fused to said first surface of said body of semiconductor material to form a seal protecting a PN junction formed at the intersection of said first emitter region with said first base region.

13. A disc-shaped thyristor having first and second opposed surfaces, comprising:

(a) a body of semiconductor material having first and second substantially flat opposed major surfaces and an edge portion extending therebetween, said body of semiconductor material including a first region of a first conductivity type, a second region of a second conductivity type, a third region of said first conductivity type, and a fourth region of said second conductivity type, said first and second regions extending to said first major surface of said body of semiconductor material, said fourth region extends to said second major surface;

(b) a first electrode having a first thickness affixed to said first region, a second cup shaped electrode having a second thickness affixed to said second region with edge portions of said first and second electrodes being exposed along said first opposed major surface of said thyristor;

(c) a third electrode having a third thickness affixed to said fourth region;

(d) a first ring-shaped glass member fused to said first opposed major surface of said body of semiconductor material to form a seal protecting a first PN junction formed at the intersection of said first and second regions;

(e) a second ring-shaped glass member fused to said edge portion of said body of semiconductor material and to the inner surface of said cup shaped electrode to form a seal protecting second and third PN junctions respectively formed at the interface of said second region with said third region and at the interface of said third region with said fourth region, wherein:

(f) said first, second and third thicknesses are selected such that destructive stresses do not develop during thermal cycling of said thyristor.

14. A disc-shaped thyristor having first and second opposed surfaces, comprising:

(a) a body of semiconductor material having first and second substantially flat opposed major surfaces and an edge portion extending therebetween said body of semiconductor material including a first emitter region, a first base region, a second base region and second emitter region, said first emitter and base regions extending to said first major surface of said body of semiconductor material, said second emitter region extending to said second major surface of said body of semiconductor material;

(b) a cathode electrode having a first thickness affixed to said first emitter region, a cup shaped gate electrode encircling said edge portions of said body of semiconductor material and having a second thickness affixed to said first base region with surface portions of said cathode electrode and said gate electrode being exposed along said first surface of said thyristor;

(c) an anode electrode having a third thickness affixed to said second emitter, with one surface of said anode electrode being exposed along said second opposed surface of said thyristor;

(d) a first ring-shaped electrically insulating member affixed to said edge portion of said body of semiconductor material;

(e) a second ring-shaped electrically insulating member coaxially positioned with respect to said first electrically insulating member with the inner surface of said second ring-shaped electrical insulating member being fused to the outer surface of said first electrically insulating member, the outer surface of said second electrically insulating member being fused to the inner surface of said cup shaped gate electrode, the combination of said first and second electrically insulating members forming a seal protecting first and second PN junctions respectively formed at the intersection of said first base region with said second base region and at the intersection of said second base region with said second emitter region; and (f) a third ring-shaped electrically insulating member fused to said first surface of said body of semiconductor material and to edge portions of said cathode and gate electrodes to form a seal protecting a PN junction formed at the intersection of said first emitter region with said first base region, wherein:

(g) said first, second and third thicknesses selected such that destructive stresses do not develop during thermal cycling of said thyristor.

15. A thyristor in accordance with claim 14 wherein said first, second and third thicknesses are respectively in the order of 0.010 inches, 0.010 inches and 0.035 inches.

16. A thyristor comprising:

(a) a body of semiconductor material having first and second substantially flat and opposed major surfaces and an edge portion extending therebetween, said body of semiconductor material including a first emitter region, a first base region, a second base region and a second emitter region with a first PN junction at the interface of said first emitter region with said first base region, a second PN junction at the interface of said first base region with said second base region and a third PN junction at the interface of said second base region with said second emitter region, said first emitter and base regions extending to said first substantially flat surface and said second emitter region extending to said second substantially flat surface;

(b) a cup shaped cathode electrode encircling said edge portions of said body of semiconductor material and having a first thickness affixed to said first emitter region along said first major surface of said body of semiconductor material;

(c) a gate electrode having a second thiceness affixed to said first base region along said first major surface of said body of semiconductor material such that said first PN junction extends to said first major surface of said body of semiconductor material between edge portions of said cathode electrode and said gate electrode;

(d) a first ring-shaped electrically insulating glass member affixed to said first major surface of said body of semiconductor material and, to edge portions of said cathode electrode and said gate electrodes thereby forming a seal protecting said first PN junction;

(e) an anode electrode having a third thickness affixed to said second emitter region along said second major surface of said body of semiconductor material; and (f) a second ring-shaped electrically insulating glass member affixed to said edge portion of said body of semiconductor material and to the inner edge of said cup shaped cathode electrode thereby forming a seal protecting said second and third PN junctions, wherein;

(g) said first, second and third thicknesses are selected such that destructive stresses do not develop during thermal cycling of said thyristor.

17. A disc-shaped thyristor having first and second opposed surfaces, comprising:

(a) a body of semiconductor material having first and second substantially flat opposed major surfaces and an edge portion extending therebetween, said body of semiconductor material including a first region of a first conductivity type, a second region of a second conductivity type, a third region of said first conductivity type, and a fourth region of said second conductivity type, said first and second regions extending to said first major surface of said body of semiconductor material, said fourth region extends to said second major surface;

(b) a first cup shaped electrode encircling said edge portions of said body of semiconductor material having a first thickness affixed to said first region, a second electrode having a second thickness affixed to second region with surface portions of said first and second electrodes being exposed along said first opposed surface of said thyristor;

(c) an anode electrode having a third thickness affixed to said fourth region;

(d) a first ring-shaped glass member fused to said first surface of said body of semiconductor material to form a seal protecting a first PN junction formed at the intersection of said first and second regions;

(e) a second ring-shaped glass member fused to said edge portion of said body of semiconductor material and to the inner surface of said cup shaped electrode to form a seal protecting sound and third PN junction respectively formed at the interface of said first region with said second region and at the interface of said third region with said fourth region, wherein:

(f) said first, second and third thicknesses are selected such that destructive stresses do not develop during thermal cycling of said thyristor.

18. A disc-shaped thyristor having first and second opposed surfaces, comprising:

(a) a body of semiconductor material having first and second substantially flat opposed major surfaces and an edge portion extending therebetween, said body of semiconductor material including a first emitter region, a first base region, a second base region and second emitter region, said first emitter and base regions extending to said first major surface of said body of semiconductor material, said second emitter region extending to said second major surface of said body of semiconductor material;

(b) a cup shaped cathode electrode encircling said edge portions of said body of semiconductor material and having a first thickness affixed to said first emitter region, a gate electrode having a second thickness affixed to said first base region with surface portions of said cathode electrode and said gate electrode being exposed along said first surface of said thyristor;

(c) an anode electrode having a third thickness affixed to said second emitter, with one surface of said anode electrode being exposed along said second opposed surface of said thyristor;

(d) a first electrically insulating member affixed to said edge portion of said body of semiconductor material;

(e) a second ring-shaped electrically insulating member coaxially positioned with respect to said first electrically insulating member with the inner surface of said second ring-shaped electrical insulating member being fused to the outer surface of said first electrically insulating member, the combination of said first and second electrically insulating members forming a seal protecting first and second PN junctions respectively formed at the intersection of said first base region with said second base region and at the intersection of said second base region with said second emitter region; and (f) a second ring-shaped electrically insulating member fused to said first surface of said body of semiconductor material to form a seal protecting a PN junction formed at the intersection of said first emitter region with said first base region, wherein:

(g) said first, second and third thicknesses selected such that destructive stresses do not develop during thermal cycling of said thyristor.

* * * * *